United States Patent [19]

Rabinowitz et al.

[11] 4,240,047
[45] Dec. 16, 1980

[54] MECHANICAL RESONATOR OSCILLATOR HAVING REDUNDANT PARALLEL DRIVE CIRCUITS

[75] Inventors: Charles M. Rabinowitz, Bloomfield; Donald A. Camp, Simsbury, both of Conn.

[73] Assignee: United Technologies Corporation, Hartford, Conn.

[21] Appl. No.: 53,452

[22] Filed: Jun. 29, 1979

[51] Int. Cl.³ .................................................. H03B 5/30
[52] U.S. Cl. .................................... 331/154; 331/183; 331/56
[58] Field of Search ........ 331/116 R, 116 FE, 116 M, 331/154-164, 183, 49, 56

[56] References Cited
U.S. PATENT DOCUMENTS

| | | | |
|---|---|---|---|
| 3,242,442 | 3/1966 | Ishimoto et al. | 331/56 X |
| 3,293,562 | 12/1966 | Hahnel | 331/56 |
| 3,504,301 | 3/1970 | Hetzel | 331/116 M |

Primary Examiner—Siegfried H. Grimm
Attorney, Agent, or Firm—Dominic J. Chiantera

[57] ABSTRACT

A mechanical oscillator of the type which includes a mechanical resonator and a resonator driver connected in a regenerative signal loop in which the driver receives the resonant frequency signal of the resonator and provides, in response thereto, a constant magnitude drive signal of equal frequency and supporting phase to the resonator to maintain a minimum amplitude for the resonant frequency signal, is provided with dual resonator drivers actively connected in parallel in the regenerative loop, each providing through a load sharing network a proportionate amount of the total drive signal magnitude in complement with that provided by the other, and each providing the full drive signal magnitude in the presence of a failure of the other.

6 Claims, 3 Drawing Figures

MECHANICAL RESONATOR OSCILLATOR HAVING REDUNDANT PARALLEL DRIVE CIRCUITS

The Government has rights in this invention pursuant to Contract No. F33615-77-C-2055 awarded by the United States Air Force, Systems Command ASD/PPMNB.

BACKGROUND OF THE INVENTION

1. Field of Invention

This invention relates to high Q mechanical oscillators, and more particularly to mechanical oscillators suitable for use in high reliability sensors.

2. Description of the Prior Art

As known, oscillators having mechanical resonators, such as quartz crystals, tuning forks, balanced beams and vibrating cylinders, oscillate at a precision frequency in the range of resonant frequencies of the device as determined by the resonator material composition, structural dimensions and loading on the device. The mechanical oscillators have a higher Q than electronic oscillators which cause the displacement amplitude and frequency of oscillation to be particularly sensitive to damping effects caused both by internal friction and by loading of the resonator by external stimuli such as air resistance, temperature and pressure. The connection of the mechanical resonator to a resonator driver in a regenerative signal loop, whereby the driver provides the mechanical resonator with a sustaining force which overcomes the damping effects and maintains the displacement amplitude at a minimum measurable value while allowing the frequency to change in response to the selected external stimuli, results in a highly sensitive device for use in sensing selected parameters such as temperature and pressure. The drivers are electronic signal amplifiers which are coupled to the mechanical resonator through suitable pick-up and drive transducers. The transducers also provide an output resonant frequency signal representative of the mechanical oscillation frequency, which is digitally compatible such that the signal frequency is readily detected by a digital signal processor without analog-to-digital (A/D) interface, all of which is known.

The mechanical resonators themselves are inherently rugged and, therefore, reliable for use in sensors mounted in high vibration environments, such as the engine mounted sensors of an engine control system. The overall reliability of the sensors, however, is limited by the electronic resonator driver which is susceptible to failure from shock and vibration. Practical considerations of size and weight preclude the use of completely redundant sensors, such that sensor reliability has been improved in the prior art through use of redundant resonator drivers, where a first or primary driver circuit is operable at all times to provide the drive signal and a secondary driver is made operable only in the event of a failure of the primary. Only one driver is connected in the regenerative loop at any one time, requiring the use of electronic "enable/disable" switches to connect the secondary circuit in line. This results in a quasi-redundant sensor which can tolerate a single failure in the electronic components, i.e. the drivers or the switches.

The disadvantages of the prior art quasi-redundant design from the standpoint of reliability include: (1) the fact that electronic enable/disable switches degrade the effect of redundant drivers because their failure rates are usually significant when compared to the total failure rate of a single driver circuit, (2) the secondary driver circuit is non-operating during operation of the primary such that a failure in the secondary remains undetected, unless discovered in a "pre-use" checkout, until the primary driver fails, and (3) the absolute interruption of the resonant frequency signal in the interval of time required to sense the primary driver failure and switch over to the secondary driver followed by a transient settling time due to offset errors between the drivers, all of which results in a signal "down time" and loss of the control function for the interval. The inability to ascertain the health of the secondary driver during primary driver operation results in a loss of reliability "coverage," a critical reliability parameter. However, the most significant disadvantage may be the signal interruption due to switching which results in the momentary loss of control since interruption of the actual pressure signal at the discharge of the fan turbine stage for less than one second could result in engine runaway and destruction.

SUMMARY OF THE INVENTION

The object of the present invention is to provide a resonator driver which overcomes all of the disadvantages of the prior art devices and which is suitable for use in high reliability mechanical oscillators.

According to the present invention, a resonator driver includes dual variable gain amplifier circuits connected in parallel between a common input which is responsive to the signal from the pick-up transducer, and a coupling network which is responsive to the individual output signals from each amplifier and which permits each amplifier to provide a proportionate amount of the full drive signal in complement with that provided by the other in a load sharing manner, either amplifier providing the full drive signal magnitude in the event of a failure in the other. In further accord with the present invention, the output signal of each amplifier is monitored to provide an instantaneous indication of driver operability, thereby providing coverage of a source failure.

The resonator driver of the present invention overcomes the prior art reliability problems for the resonator drivers used in high reliability sensors, thereby significantly improving overall reliability for the sensor without increasing the size, weight and cost of the sensor. This is achieved by eliminating the enable/disable switches, by providing identical amplifier configurations for each of the dual drivers, and by maintaining each amplifier in an active operating state during normal operation to provide constant monitoring of the operability of each. The foregoing and various other features and advantages of the present invention will become more apparent in the light of the following detailed description of a preferred embodiment thereof, as illustrated in the accompanying drawing.

DETAILED DESCRIPTION

Figure 2:
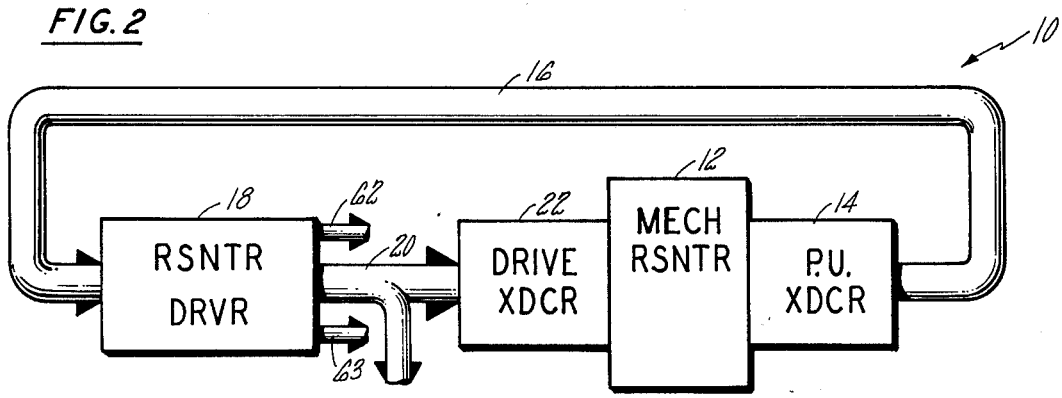
FIG. 2 is a simplified block diagram illustration of a regenerative signal loop comprising a mechanical resonator and the resonator driver of FIG. 1.

Referring first to FIG. 2, a mechanical oscillator 10 includes a mechanical resonator 12, such as a vibrating cylinder, a balance beam, a tuning fork, or quartz crystal, connected in a regenerative signal loop through a pick-up transducer 14 and lines 16 to a resonator driver 18, the output of which is connected through lines 20 and a drive transducer 22 to an input of the resonator to complete the closed loop. The pick-up transducer 14 is suitably disposed on the resonator to sample and convert the mechanical oscillation displacement into an electrical signal of equal frequency and representative amplitude. The transducer is of a type known in the art, with the particular type being dependent on the mechanical resonator configuration. For a vibrating cylinder type resonator the pick-up transducer includes one or more electromagnets placed in proximity to the vibrating cylinder wall, which provide a magnetic flux field and detect the displacement amplitude of the wall as a change in magnetic reluctance which produces an alternating current signal in the coils, at an amplitude and frequency representative of the mechanical oscillation. The transducer output signal is presented through the lines 16 to the resonator driver which amplifies the pick-up signal to provide a constant amplitude drive signal at the sensed resonant frequency to the resonator through the drive transducer 22, which is similar to the pick-up transducer 14. The transducer 14, for a vibrating cylinder resonator, transduces the electrical drive signal into a modulated magnetic flux field which sustains the resonator oscillation.

Figure 1:
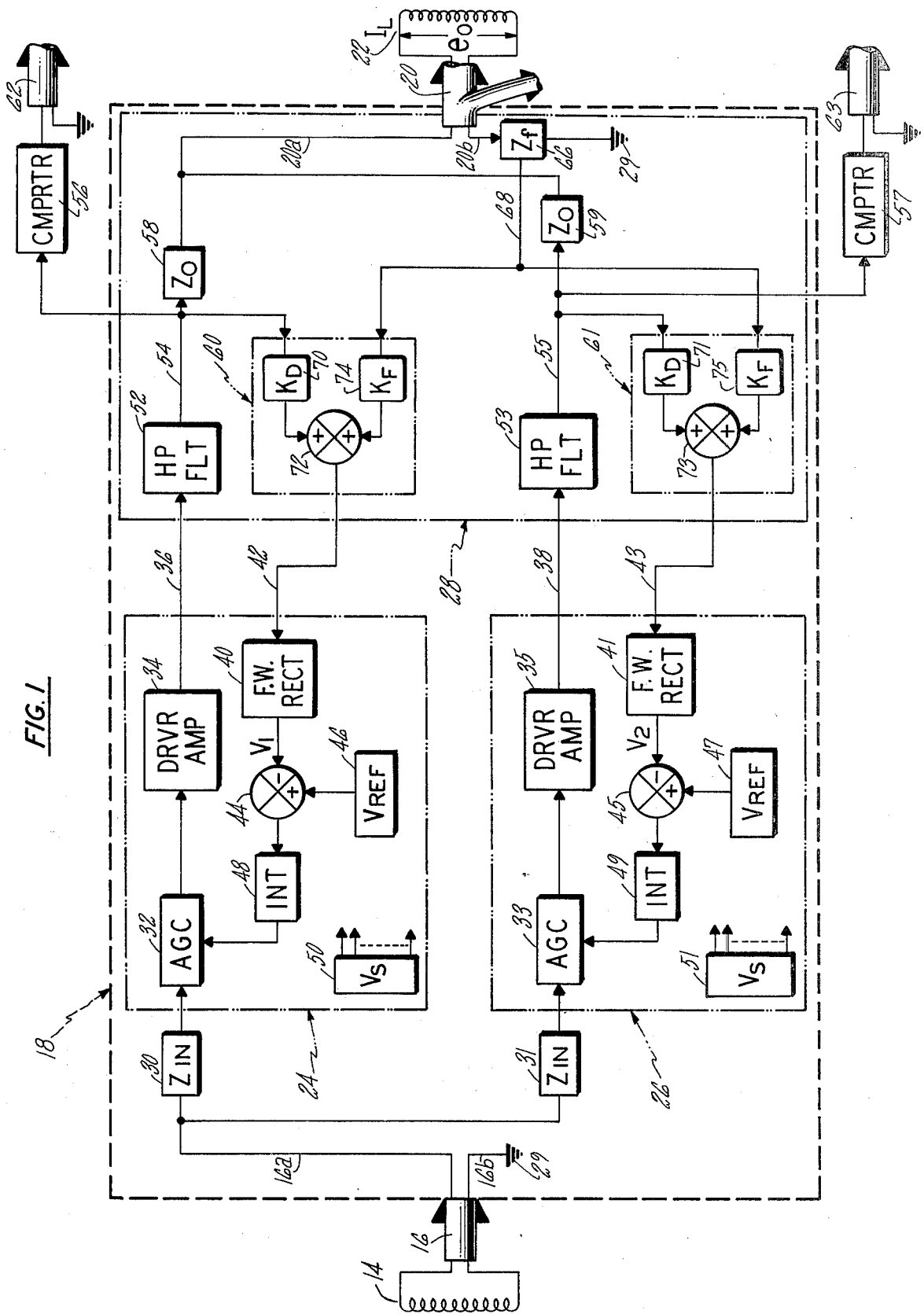
FIG. 1 is a simplified block diagram illustration of a resonator driver according to the present invention, as may be used in a mechanical resonator sensor.

Referring now to FIG. 1, a resonator driver 18 according to the present invention includes dual amplifiers 24, 26. The amplifiers are identical and both are active simultaneously, i.e. each amplifier receives the signal from the pick-up transducer 14 and each is connected at its output to a coupling network 28. The lines 16 from the pick-up transducer to the driver include signal line 16a and ground line 16b connected to the driver signal ground 29. The signal line is connected through isolating impedances 30, 31 to an input of each amplifier and presented within each amplifier to associated automatic gain control (AGC) circuits 32, 33, of a type known in the art, the outputs of which are connected through associated drive amplifiers 34, 35 to lines 36, 38 at the output of each amplifier. Each amplifier 24, 26 includes full wave rectifier circuits 40, 41 for providing a full wave rectified DC signal equivalent of an alternating feedback drive signal presented from the coupling network on lines 42, 43 respectively. The DC signals $V_1$, $V_2$ from each of the rectifiers 40, 41 are summed in associated summing junctions 44, 45 with a reference signal provided by one of the associated signal sources 46, 47 ($V_{REF1}$, $V_{REF2}$) in each amplifier. The magnitude of each reference signal is ideally equal and each defines the desired constant magnitude of the drive signal. The presence of a sum signal from the junctions 44, 45 is definitive of a difference magnitude between the reference signal magnitude and the associated DC feedback signal and represents an error in drive signal magnitude, which is presented to integrators 48, 49. The integrators are of a type known in the art and may include lead/lag compensation, as required to stabilize each loop. Each integrator presents the integral of the error signal to the associated one of the AGC circuits 32, 33, each of which responds by adjusting its gain to a present value amplification factor in dependence on the present value of the error signal integral, as required to correct the drive signal amplitude. The amplifiers 24, 26 also include individual power sources ($V_S$) 50, 51, which in combination with the individual reference signal sources 46, 47 provide amplifier autonomy and improved reliability by eliminating the resonator driver susceptability to a single reference or power source failure.

In operation each amplifier provides variable gain amplification of the pick-up signal at a value established in dependence on the desired minimum output drive signal amplitude. The variable gain is required since the change in oscillation amplitude due to sensed parameter loading and ambient temperature changes may vary as much as 50:1. As a result the gain of each amplifier is varied with the instantaneous difference amplitude between the respective DC feedback signals $V_1$, $V_2$ from the rectifiers 40, 41 and the reference source (46, 47) signals to provide the constant magnitude drive signal. The operation of each amplifier is identical, such that for the amplifier 24 the DC signal ($V_1$) summed with the reference signal ($V_{REF}$) provides an error signal ($V_e$), where $V_e = V_{REF1} - V_1$. The integrator 48 provides any resultant integrated error value to the AGC circuit 32 which responds by adjusting the gain accordingly. If $V_1$ is greater than $V_{RED1}$ a negative $V_e$ error signal results and the AGC circuit responds by decreasing the gain, thereby reducing the output drive signal on the line 36 until $V_1$ is equal to the reference, at which time a steady state gain condition is reached. Similarly if $V_1$ is less than $V_{REF}$ the integration is in the positive direction resulting in an increased gain in the AGC and an increased amplitude signal on the line 36.

The dual amplifiers 24, 26 both operate simultaneously to provide the full drive current so long as both are operative, therefore, the closed loop response of each amplifier to changes in the drive signal magnitude must be limited to prevent one amplifier from providing full drive current to the exclusion of the second amplifier. Since the loop gain must be sufficient to ensure regulation of the drive signal magnitude to the desired value, the limiting of the loop response is provided by introducing a "droop gain" characteristic in the feedback signal presented to the amplifiers on the lines 42, 43 by the coupling network 28. The droop gain provides a portion of the total feedback signal. This portion is responsive only to the amplifier output signal, not the drive signal, thereby providing a loop around the amplifier itself while de-sensitizing a portion of the feedback signal to changes in the drive signal, or load, all of which is described in detail hereinafter.

The coupling network 28 includes high pass frequency filters 52, 53, each receiving the AC output signals from the amplifiers 24, 26 on the lines 36, 38. The filters provide DC signal rejection to block any offset errors, or more particularly the DC signal resulting from saturation of either amplifier during failure, from being presented to the output lines 20. The alternating output signals from the filters are presented through lines 54, 55, to the input of each of the comparators 56, 57, to one side of output impedances 58, 59, and to feedback networks 60, 61, respectively. The other side of the output impedances are each connected to the high signal line 20a of the output lines 20 connecting the resonator driver to the drive transducer 22. In the embodiment of FIG. 1 the resonator driver provides the drive signal as a constant magnitude current signal, such that the low signal line 20b from the transducer is returned to the network 28 and connected to one side of a current sampling feedback impedance 66, the other side of which is connected to the signal ground 29. As may be obvious, if a constant voltage drive signal is required, the output signal magnitude may be monitored between the lines 20a, 20b with the line 20b connected directly to signal ground 29. The feedback impedance 66 may be a passive element or an active network, and provides the feedback signal indication of the drive signal current through a line 68 to a second input on each of the feedback networks 60, 61.

The comparators 56, 57 continuously sample the output signals from each amplifier to determine the operability of each amplifier, such that a failure in either amplifier is immediately detected by the associated comparator. The outputs from the comparators 56, 57 are provided on lines 61, 63 to compatible signal conditioning circuitry within the particular system utilizing the sensed signal on the lines 20, or to any other signal compatible monitoring apparatus deemed desirable. In this manner the existence of a failed amplifier and the assumption of full load by the second amplifier is immediately flagged to allow for possible corrective action, thereby greatly extending the reliability coverage of the sensor. This is possible only as a result of the simultaneous operation of both amplifiers in providing the drive signal in a load sharing manner, and is in marked contrast to the prior art systems where the standby, or normally inactive amplifier status is not known until it is switched "on line" following a failure of the primary amplifier, at which time notice may be too late.

The feedback networks 60, 61 each receive the AC output signal $E_{01}\text{Sin}(\omega+\phi)$, $E_{02}\text{Sin}(\omega+\phi)$ from the associated amplifiers on the lines 54, 55, and the common feedback signal $V_f\text{Sin}(\omega+\phi\pm\theta)$ on the line 68. In each feedback network the output signal magnitudes are multiplied by an equal value droop gain constant ($K_D$) 70, 71 and summed in summing junctions 72, 73 with the common feedback signal which is first multiplied by an equal value feedback gain constant ($K_F$) 74, 75. The sum signals are provided on lines 42, 43 to the full wave rectifiers 40, 41, each having a gain $2/\pi K_R$, which provide the DC sum feedback signals $V_1$, $V_2$ which are summed with the reference signals in the junctions 44, 45 to provide the respective amplifier error signals ($V_e$).

In the operation of the resonator driver of FIG. 1 the drive signal is a constant magnitude current signal ($I_D$), which for a transducer impedance $Z_L$ is equal to:

$$I_D = \frac{E_{01}\text{Sin}(\omega t + \phi) + E_{02}\text{Sin}(\omega t + \phi)}{Z_0 + 2(Z_L + Z_f)}, \quad \text{Eq. (1)}$$

In order to simplify the analysis of the coupling network in providing the load sharing between amplifiers, only the real, or resistive components of the impedances $Z_O$, $Z_L$, $Z_f$, and only the absolute magnitude of the voltage and current signals are considered; therefore, Equation 1 may be rewritten as:

$$I_D = \frac{E_{01} + E_{02}}{Z_E}, \text{ where } Z_E = Z_0 + 2(Z_L + Z_f), \quad \text{Eq. (2).}$$

Since the feedback signal on the line 68 is:

$$V_f = Z_f I_D, \quad \text{Eq. (3),}$$

the sum feedback signals ($V_1$, $V_2$) presented from the full wave rectifiers 40, 41 to the junctions 44, 45 are equal to:

$$V_1 = \left(\frac{2}{\pi} \cdot K_R\right)(K_D \cdot E_{01} + K_f \cdot Z_f \cdot I_D), \quad \text{Eq. (4),}$$

$$V_2 = \left(\frac{2}{\pi} \cdot K_R\right)(K_D \cdot E_{02} + K_f \cdot Z_f \cdot I_D), \quad \text{Eq. (5).}$$

Each sum feedback signal includes a drive signal responsive component ($K_f \cdot Z_f \cdot I_D$) and an amplifier output responsive component ($K_D \cdot E_O$). Under normal steady state operation, with each amplifier operating in its linear active region, the sum feedback signal magnitude is equal to that of $V_{REF}$, i.e.:

$$V_{REF1} = V_1, \quad V_{REF2} = V_2 \quad \text{Eq. (6).}$$

In the absence of the droop gain ($K_D=0$) equations 6 would each be satisfied by the same drive signal component, if the amplifier loops were perfectly balanced. Since perfect balance is not achievable due to tolerance conditions in each loop, only one of the amplifier loops could be satisfied. As a result one amplifier would assume full load responsibility and the second would cut-off, with the loss of load sharing.

With droop gain, under ideal steady state conditions (balanced) the relationship between amplifier output signal magnitudes is determined from equations (2), (4), (5) and (6) as:

$$K_D \cdot E_{01} + K_f \cdot Z_f \cdot \left(\frac{E_{01} + E_{02}}{Z_E}\right) = \quad \text{Eq. (7)}$$

$$K_D \cdot E_{02} + K_f \cdot Z_f\left(\frac{E_{01} + E_{02}}{Z_E}\right),$$

and $$E_{01} = E_{02} \quad \text{Eq. (8)}$$

Therefore, through the coupling network 28, each amplifier provides equal magnitude output signals under ideal conditions of steady state in which there are zero tolerances associated with $V_{REF}$ and the various gains of the rectifier and feedback networks. The magnitudes of $E_{01}$, $E_{02}$ may be expressed from equations (2), (4), (5) and (6) as:

$$E_{01} = \left[\frac{Z_E}{K_D \cdot Z_E + K_f \cdot Z_f}\right] \cdot \frac{\pi}{2K_R} \cdot \quad \text{Eq. (9A)}$$

$$V_{REF1} - \left[\frac{K_f \cdot Z_f}{K_D \cdot Z_E + K_f \cdot Z_f}\right] \cdot E_{02},$$

and $$E_{02} = \left[\frac{Z_E}{K_D \cdot Z_E + K_f \cdot Z_f}\right] \cdot \frac{\pi}{2K_R} \cdot \quad \text{Eq. (9B).}$$

$$V_{REF2} - \left[\frac{K_f \cdot Z_f}{K_D \cdot Z_E + K_f \cdot Z_f}\right] \cdot E_{01},$$

If the loops become unbalanced due to a parameter shift in one amplifier, such as $V_{REF2}$, while all other parameters remain equal, the magnitude of $E_{01}$ and $E_{02}$ will both change to satisfy the steady state conditions of equations (6). $E_{01}$ will change to accommodate both $\Delta V_{REF2}$ and the resultant change in $E_{01}$, whereas $E_{01}$ will change to accommodate the change in $E_{02}$ alone. The change in magnitude of $E_{01}$ as a function of a change in $E_{02}$ is given by:

$$\Delta E_{01} = - \frac{K_f \cdot Z_f}{K_D \cdot Z_E + K_f \cdot Z_f} \cdot \Delta E_{02} \qquad \text{Eq. (10),}$$

such that the change in $E_{01}$ is proportional with opposite sign to the change in $E_{02}$, and by an amount less than the whole due to the droop gain $K_D$. The term $$\frac{K_f \cdot Z_f}{K_D \cdot Z_E + K_f \cdot Z_f}$$

is the tracking gain between amplifiers which defines the permissable sensitivity of each amplifier to the change in output of the other. The tracking gain allows for the stability of the load sharing condition between the amplifiers since if $E_{01}$ could change by the full amount, so as to satisfy the constant magnitude of the output drive signal, the amplifier 24 would assume full authority of the load and reduce $E_{02}$ substantially to zero. This is undesirable since the operative condition of amplifier 26 could not be monitored with the consequent loss of reliability coverage. The tracking gain, therefore, allows the changing output amplifier to reestablish steady state operation thereby satisfying Eq. (6) and providing equal, or near equal load sharing.

Although the tracking gain is a ratiometric value of the gains $K_D$, $K_f$ and the impedances $Z_E$, $Z_f$, the tracking gain value is essentially established by the droop gain $K_D$ since the value of $K_f$ must be selected to satisfy the overall loop gain of the amplifier, and impedances $Z_E$ and $Z_f$ are selected in dependence on the load. The tracking gain is established at a value which accounts for the finite circuit tolerances associated with the coupling network ($\Delta K_D$, $\Delta K_f$ and $\Delta Z_f$) and those of the amplifiers ($\Delta V_{REF}$, $\Delta K_R$), all of which define the shifted ratio limits from the ideal 50/50 load sharing condition. If the worst case tolerances associated with each amplifier in combination with its portion of the feedback network is ±5% the tracking gain may be established at 0.9V/V, which allows for the sum (±10%) of the worst case tolerances of the amplifiers and coupling network. If the impedances $Z_L$ and $Z_f$ are defined in terms of $Z_O$ by the assumed relationships $Z_L=0.4Z_O$ and $Z_f=0.1Z_O$, such that $Z_E=2Z_O$, the droop gain ($K_D$) may be defined in terms of the feedback gain ($K_f$) by a ratio, which for a tracking gain of 0.9V/V is equal to $(K_D/K_f)=(1/180)$.

The change in the drive current signal magnitude ($\Delta I_D$) as a function of a transient change in either amplifier's output signal magnitude is obtained by taking the differential of Eq. (2):

$$\Delta I_D = \pm \frac{\Delta E_{01}}{Z_E} + \frac{\Delta E_{02}}{Z_E}, \qquad \text{Eq. (11).}$$

Substituting equation (10) into equation (11), the change in drive current may be written as:

$$\Delta I_D = \frac{\Delta E_{02}}{Z_E} \left( 1 - \frac{K_f \cdot Z_f}{K_D \cdot Z_E + K_f \cdot Z_f} \right), \qquad \text{Eq. (12).}$$

Dividing equation (12) by equation (2) to obtain the percentage change results in:

$$\frac{\Delta I_D}{I_D} = \frac{\Delta E_{02}}{E_{01} + E_{02}} \cdot \left( 1 - \frac{K_f \cdot Z_f}{K_D \cdot Z_E + K_f \cdot Z_f} \right), \qquad \text{Eq. (13),}$$

since $E_{02}/(E_{01}+E_{02}) = \frac{1}{2}$ in the absence of circuit tolerances, the change in drive signal current for a change ($\Delta$) in $E_{02}$ is equal to: $(\Delta I_D/I_D)=\Delta(\frac{1}{2})(1-0.9)=\Delta(0.05)$, or 5% of the change in $E_{02}$. Although the output signal magnitude from each amplifier output can only track a change in magnitude of the other amplifier to within 10%, i.e. the tracking tolerance as established by the tracking gain of 0.9V/V, the change in drive current magnitude is 5% of the amplifier change, or one-half the tracking tolerance. If at a given instant of time $\Delta E_{02}=+5.0\%$, then $\Delta E_{01}=-4.5\%$ and $\Delta I_D=+0.25\%$. In the event of a worst case failure in either amplifier resulting in a zero amplitude sinusoidal output signal, i.e. $E_{02}=0$ volts, then $\Delta E_{02}=-100\%$, $\Delta E_{01}=+90\%$, and $\Delta I_D=-5\%$. Therefore, even with a complete failure in one amplifier which causes the amplifier output signal amplitude to go to zero, the remaining good amplifier, through the coupling network, assumes full load responsibility to maintain the drive signal magnitude to a value which is within one-half of the threshold tolerance, i.e. a tolerance which is equal to the normal circuit tolerances of the amplifier and network.

Figure 3:
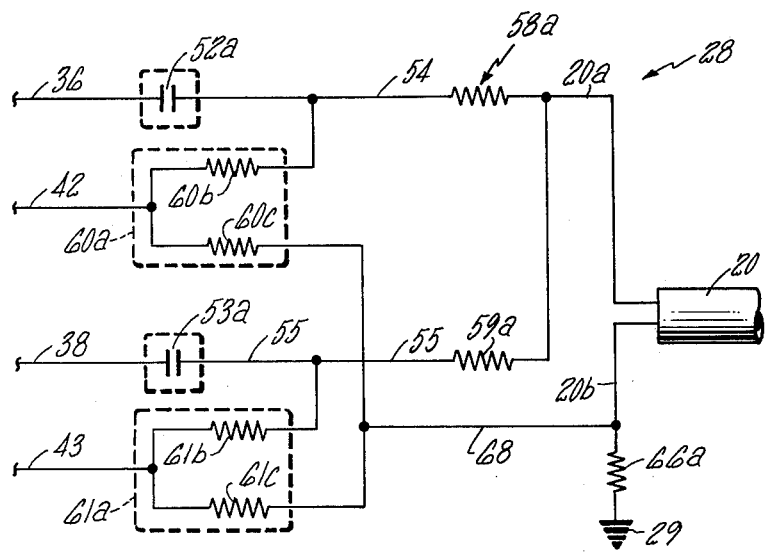
FIG. 3 is a detailed schematic illustration of a portion of the resonator driver of FIG. 1.

Referring now to FIG. 3, in a passive embodiment of the coupling network 28 of FIG. 1, the high pass filters (52, 53 of FIG. 1) are provided by capacitors 52a, 53a. The output impedances ($Z_O$) are provided by resistors ($R_O$) 58a, 59a, each connecting the amplifier AC output signals to the output line 20a. In FIG. 3 each of the feedback networks 60a, 60b have single resistor inputs for each of the two signals presented thereto. In the network 60a the amplifier output signal on the line 54 and the feedback signal on the line 68 are coupled through resistors 60b, 60c, directly to the line 42 which provides the summing junction (72 of FIG. 1). Similarly the feedback network 61a includes resistors 61b and 61c to couple the amplifier output signal on the line 55 and feedback signal on the line 68 directly to the line 43. The feedback impedance (66 of FIG. 1) comprises current sampling resistor 66a ($R_f$).

If the resistor values of FIG. 3 are assumed to be related to the output resistors ($R_O$) in the same manner described hereinbefore for the impedances of FIG. 1, with only the resistive portion ($R_L$) of the drive transducer impedance ($Z_L$) being considered, than:

$R_L=0.4R_O$, $R_f=0.1R_O$, and $R_E=2R_O$.

If the tracking tolerance term is again assumed to be 0.9V/V, the relationships of the resistance values given above again results in the ratio of droop gain $K_D$ to feedback gain $K_f$ equal to: $(K_D K_f)=1/180$. Although the droop gain value is only 0.56% of the feedback gain value, it contributes approximately 5.6% of the total sum feedback signal ($V_1$, $V_2$) due to the larger magnitude signals on the lines 54, 55 as opposed to the feedback signal on the line 68. It is that portion of the sum feedback signals provided by the droop gain which is nonresponsive to the drive signal, thereby limiting each amplifier and ensuring load sharing under normal operation.

In FIG. 3 the actual values of the droop gain and feedback gain are established through the simple resistor divider network, where:

$$K_D \cong \frac{R_{60c}}{R_{60b} + R_{60c}}, \text{ and } K_f \cong \frac{R_{60b}}{R_{60b} + R_{60c}}.$$

The approximation is due to the additional considerations which must be given to the value of the feedback resistance ($R_f$) in contributing to the overall gain calculation, however, since the resistors of the feedback networks are much greater in value than the feedback resistor 66a any resultant error is minimal.

The resonator driver of the present invention provides a highly reliable configuration in which redundant driver amplifiers are each actively connected in parallel to provide, through a coupling network responsive to each, simultaneous operation of both amplifiers to provide, in combination, in a load sharing manner, the output drive signal. Each amplifier is controlled through the coupling network to produce an output signal magnitude which is in complement with that of the other amplifier in providing the constant magnitude of the drive signal during normal operation, and either amplifier may provide the full drive signal magnitude in the event of failure of the other. Similarly, although the invention has been shown and described with respect to illustrative embodiments thereof, it should be understood by those skilled in the art that the foregoing and various other changes, omissions and additions in the form and detail thereof may be made therein without departing from the spirit and the scope of the invention.

Having thus described typical embodiments of our invention, that which we Claim as new and desire to secure by Letters Patent is:

1. An improved mechanical oscillator of the type which includes a mechanical resonator and a resonator driver connected in a regenerative signal loop in which the driver receives the resonant frequency signal of the resonator and provides, in response thereto, a constant magnitude drive signal of equal frequency and supporting phase to the resonator to maintain a minimum amplitude for the resonant frequency signal, the improvement being a resonator driver comprising:

first and second signal amplifier means, each responsive to the resonant frequency signal from the resonator and each responsive to an associated sum feedback signal presented thereto, said first and second amplifier means each including a signal source for providing a reference signal definitive of the selected constant magnitude of the drive signal and each further including variable gain amplifier means responsive to said reference signal and said sum feedback signal for providing a gain amplification factor at a present value in dependence on a present difference signal magnitude therebetween, said first and second amplifiers each providing an output signal at a magnitude equal to the product of said amplification factor and the resonant frequency signal from the resonator; and coupling network means, connected for response to said first and second amplifier means, for providing at an output thereof the drive signal at a constant magnitude equal to a proportionate sum of said output signal magnitudes, said network means providing to each of said first and second amplifier means separate sum feedback signals, each at a magnitude in dependence jointly on the drive signal magnitude and the associated amplifier means output signal magnitude.

2. The oscillator of claim 1, wherein said coupling network means includes plural feedback network means, one associated with each of said first and second amplifier means, each of said feedback means having first and second proportional gain means and each being responsive to the output signal magnitude from the associated one of said amplifier means presented to a first input thereof and each being responsive to the drive signal magnitude presented to a second input thereof, for providing to the associated amplifier means said separate sum feedback signal at a magnitude equal to the sum of the products of the associated amplifier means output signal magnitude multiplied by a first proportional gain constant and the drive signal magnitude multiplied by a second proportional gain constant.

3. The oscillator of claim 1, wherein said coupling network means includes plural high pass frequency filter means, one associated with each of said first and second amplifier means, each providing AC coupling of said output signal from the associated one of said amplifier means to said coupling network.

4. The oscillator of claim 1, wherein said coupling network provides the drive signal at a constant current magnitude equal to the proportionate sum of said output signal magnitudes.

5. The oscillator of claim 1, wherein said coupling network provides the drive signal at a constant voltage magnitude equal to the proportionate sum of said output signal magnitudes.

6. The oscillator of claim 1, wherein said coupling network provides the drive signal at a constant magnitude equal to said proportionate sum of said output signal magnitudes in the presence of said output signals from each of said first and second amplifier means, said coupling network providing the drive signal at a constant magnitude equal to a proportionate part of a present one of said output signals in the absence of the other one of said output signals.

* * * * *

UNITED STATES PATENT AND TRADEMARK OFFICE
CERTIFICATE OF CORRECTION

PATENT NO. : 4,240,047
DATED : December 16, 1980
INVENTOR(S) : Charles M. Rabinowitz and Donald A. Camp It is certified that error appears in the above-identified patent and that said Letters Patent are hereby corrected as shown below:

Column 5, line 19, "61" should be --62--.

Column 5, line 36, "$(\omega+\phi)$" should be --$(\omega t+\phi)$--.

Column 5, line 36, "$(\omega+\phi)$" should be --$(\omega t+\phi)$--.

Column 5, line 38, "$(\omega+\phi\pm\theta)$" should be --$(\omega t+\phi\pm\theta)$--.

Column 7, line 5, "$E_{01}$" should be --$E_{02}$--.

Column 8, line 24, "$\Delta E_{01}-4.5\%$" should be --$\Delta E_{01}=-4.5\%$--.

Signed and Sealed this

*Thirty-first* Day of *March 1981*

[SEAL]

*Attest:*

RENE D. TEGTMEYER

*Attesting Officer*  *Acting Commissioner of Patents and Trademarks*